(12) United States Patent
Johnson

(10) Patent No.: US 7,379,641 B1
(45) Date of Patent: May 27, 2008

(54) FIBER-BASED OPTICAL ALIGNMENT SYSTEM

(75) Inventor: Morgan T. Johnson, Portland, OR (US)

(73) Assignee: Advanced Inquiry Systems, Inc., Hillsboro, OR (US)

( * ) Notice: Subject to any disclaimer, the term of this patent is extended or adjusted under 35 U.S.C. 154(b) by 0 days.

(21) Appl. No.: 11/799,550

(22) Filed: May 1, 2007

(51) Int. Cl.
G02B 6/26 (2006.01)
G02B 6/04 (2006.01)
G02B 6/42 (2006.01)
G02B 6/30 (2006.01)

(52) U.S. Cl. .......................... 385/52; 385/49; 385/115

(58) Field of Classification Search ................. 385/49, 385/52, 115
See application file for complete search history.

(56) References Cited

U.S. PATENT DOCUMENTS

| | | | |
|---|---|---|---|
| 6,181,856 B1 * | 1/2001 | Brun | 385/52 |
| 6,724,961 B2 * | 4/2004 | Greene et al. | 385/52 |
| 6,763,157 B1 * | 7/2004 | Williams et al. | 385/15 |
| 6,792,185 B1 * | 9/2004 | Ahrens et al. | 385/115 |
| 6,941,034 B2 * | 9/2005 | Kuboi | 385/17 |
| 7,038,191 B2 * | 5/2006 | Kare et al. | 250/227.11 |

* cited by examiner

*Primary Examiner*—Sung Pak
*Assistant Examiner*—Daniel Petkovsek
(74) *Attorney, Agent, or Firm*—Werner & Axenfeld, PC

(57) ABSTRACT

A low-cost alignment system suitable for aligning a wafer to a test fixture includes a bundle of optical fibers wherein at least one fiber serves to deliver illumination to the alignment target from an end thereof, and a plurality of receiver fibers, each having ends with a known spatial relationship to the end of the illuminator fiber. The ends of the fiber bundle have a known spatial relationship to the fixture. In some embodiments, the fiber bundle is disposed within the fixture such that there is an unobscured optical path between the wafer and the receiving and illuminating ends of the fibers. In some embodiments, the fiber bundle is coupled to a light source and a light sensor mounted on the fixture. In some embodiments the alignment target is one or more bonding pads disposed on a wafer.

18 Claims, 14 Drawing Sheets

FIBER-BASED OPTICAL ALIGNMENT SYSTEM

FIELD OF THE INVENTION

The present invention relates generally to semiconductor test and manufacturing equipment, and more particularly relates to methods and apparatus for aligning equipment to a wafer.

BACKGROUND

Advances in semiconductor manufacturing technology have resulted in, among other things, reducing the cost of sophisticated electronics to the extent that integrated circuits have become ubiquitous in the modern environment.

As is well-known, integrated circuits are typically manufactured in batches, and these batches usually contain a plurality of semiconductor wafers within and upon which integrated circuits are formed through a variety of semiconductor manufacturing steps, including, for example, depositing, masking, patterning, etching, implanting, annealing, planarizing and so on.

Completed wafers are tested to determine which die, or integrated circuits, on the wafer are capable of operating according to predetermined specifications. In this way, integrated circuits that cannot perform as desired are not packaged, or otherwise incorporated into finished products.

It is common to manufacture integrated circuits on roughly circular semiconductor substrates, or wafers. Further, it is common to form such integrated circuits so that conductive regions disposed on, or close to, the uppermost layers of the integrated circuits are available to act as terminals for connection to various electrical elements disposed in, or on, the lower layers of those integrated circuits. These conductive regions are typically referred to as pads. In testing, these pads are commonly contacted with a probe card. Unfortunately, the dimensions, or area, of pads have been decreasing which makes contacting such pads with a conventional probe card difficult and time consuming.

What is needed are lower-cost, less-complex apparatus and methods to increase the efficiency of operations associated with testing the integrated circuits of a wafer.

SUMMARY OF THE INVENTION

Briefly, a low-cost alignment system suitable for aligning a wafer to a test fixture includes a bundle of optical fibers wherein at least one fiber serves to deliver illumination to the alignment target from an end thereof, and a plurality of receiver fibers, each having ends with a known spatial relationship to the end of the illuminator fiber. The ends of the fiber bundle have a known spatial relationship to the fixture. In some embodiments, the fiber bundle is disposed within the fixture such that there is an unobscured optical path between the wafer and the receiving and illuminating ends of the fibers. In some embodiments, the fiber bundle is coupled to both a light source and a light sensor mounted on the fixture. In some embodiments the alignment target is one or more bonding pads disposed on a wafer.

DETAILED DESCRIPTION

Figure 1:
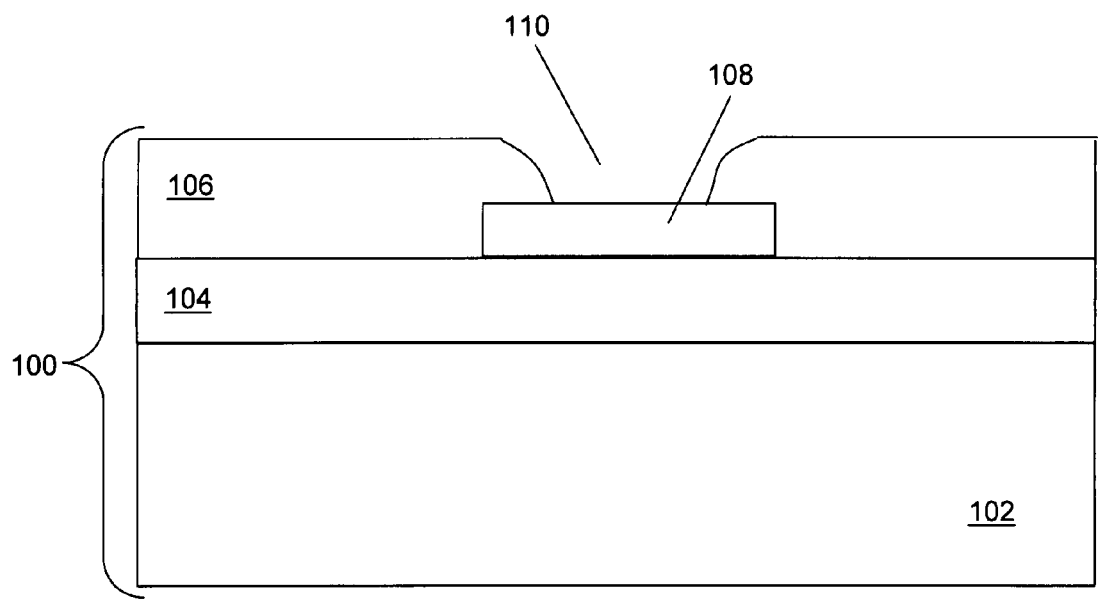
FIG. 1 is a cross-sectional view of a bond pad disposed on a dielectric layer and further having a topside layer disposed over the dielectric layer with openings therethrough exposing portions of the bond pad.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Terminology

Reference herein to "circuit boards", unless otherwise noted, is intended to include any type of substrate upon which circuits may be placed. For example, such substrates may be rigid or flexible, ceramic, flex, epoxy, FR4, or any other suitable material.

Pad refers to a metallized region of the surface of an integrated circuit, which is used to form a physical connection terminal for supplying power to, and communicating signals to and/or from the integrated circuit. Although pads are normally constructed from a metal or metal alloy, any suitable conductive material may be used as long as the optical reflectivity of the pad is different from the optical reflectivity of the surrounding material, typically but not exclusively the topside passivation layer of an integrated circuit.

The expression "wafer translator" refers to an apparatus facilitating the connection of pads (sometimes referred to as terminals, I/O pads, contact pads, bond pads, bonding pads, chip pads, test pads, or similar formulations) of unsingulated integrated circuits, to other electrical components. It will be appreciated that "I/O pads" is a general term, and that the present invention is not limited with regard to whether a particular pad of an integrated circuit is part of an input, output, or input/output circuit. A wafer translator is typically disposed between a wafer and other electrical components, and/or electrical connection pathways. The wafer translator is typically removably attached to the wafer (alternatively the wafer is removably attached to the translator). The wafer translator includes a substrate having two major surfaces, each surface having terminals disposed thereon, and electrical pathways disposed through the substrate to provide for electrical continuity between at least one terminal on a first surface and at least one terminal on a second surface. The wafer-side of the wafer translator has a pattern of terminals that matches the layout of at least a portion of the pads of the integrated circuits on the wafer. The wafer translator, when disposed between a wafer and other electrical components such as an inquiry system interface, makes electrical contact with one or more pads of a plurality of integrated circuits on the wafer, providing an electrical pathway therethrough to the other electrical components. The wafer translator is a structure that is used to achieve electrical connection between one or more electrical terminals that have been fabricated at a first scale, or dimension, and a corresponding set of electrical terminals that have been fabricated at a second scale, or dimension. The wafer translator provides an electrical bridge between the smallest features in one technology (e.g., pins of a probe card) and the largest features in another technology (e.g., bonding pads of an integrated circuit). For convenience, wafer translator is referred to simply as translator where there is no ambiguity as to its intended meaning. In some embodiments a flexible wafer translator offers compliance to the surface of a wafer mounted on a rigid support, while in other embodiments, a wafer offers compliance to a rigid wafer translator. The surface of the translator that is configured to face the wafer in operation is referred to as the wafer-side of the translator. The surface of the translator that is configured to face away from the wafer is referred to as the inquiry-side of the translator. An alternative expression for inquiry-side is tester-side.

The expression "edge extended wafer translator" refers to an embodiment of a translator in which electrical pathways disposed in and/or on the translator lead from terminals, which in use contact the wafer under test, to electrical terminals disposed outside of a circumferential edge of a wafer aligned for connection with, or attached to the edge extended translator.

Inquiry system interface refers to apparatus disposed between the inquiry-side of a translator and an inquiry system. Inquiry system interfaces provide at least electrical pathways coupled between the inquiry-side of a translator and an inquiry system. Inquiry system interfaces may incorporate a variety of passive and/or active electrical components, as well as a variety of mechanical devices for attaching, coupling, connecting, or communicating to the inquiry-side of a translator and/or the inquiry system (e.g., a tester). Various implementations of inquiry system interfaces may be as simple as a circuit board that passes signals from one surface to the other, or may be complex apparatus including active electronics, and mechanical devices suitable for placing, orienting and/or aligning the inquiry system interface.

The expression "translated wafer" refers to a wafer/wafer translator pair in the attached state, wherein a predetermined portion of, or all of, the contact pads of the integrated circuits on the wafer are in electrical contact with corresponding electrical connection means disposed on the wafer-side of the translator. Typically, the wafer translator is removably attached to the wafer. Removable attachment may be achieved, for example, by means of vacuum, or pressure differential, attachment.

The terms chip, integrated circuit, semiconductor device, and microelectronic device are sometimes used interchangeably in this field. The present invention relates to the manufacture and test of chips, integrated circuits, semiconductor devices and microelectronic devices as these terms are commonly understood in the field.

FIG. 1 illustrates a wafer with a bonding pad and a topside passivation layer, with the topside passivation layer having an opening therethrough that exposes a portion of the bond pad. More particularly, FIG. 1 shows a wafer 100 including a wafer substrate 102 with a dielectric layer 104 disposed thereon, a bond pad 108 disposed on dielectric layer 104, and a topside passivation layer 106 disposed on dielectric layer 104. As shown in FIG. 1, topside passivation layer 106 has an opening 110 that exposes a portion of bonding pad 106. It is noted that an integrated circuit typically has a plurality of bonding pads. It is further noted that a wafer having integrated circuits formed thereon typically has layers of conductors, dielectric insulators, and active devices, which are not material for describing the present invention and for simplicity of illustration are not shown in FIG. 1.

Figure 2:
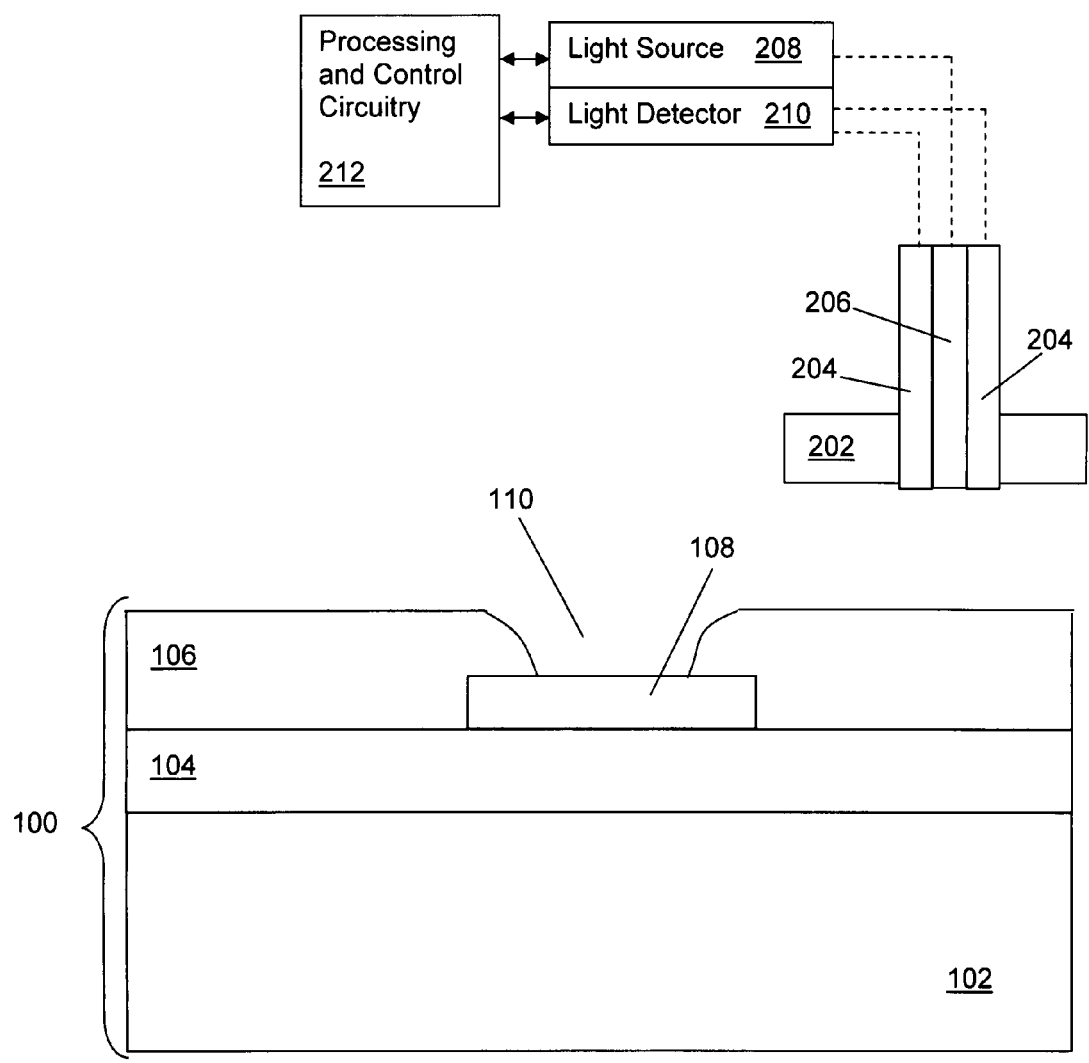
FIG. 2 is a cross-sectional view of bond pad on an integrated circuit and a fiber-based optical alignment apparatus in accordance with the present invention.

Referring to FIG. 2, the wafer of FIG. 1 is shown in conjunction with a block diagram representation of a fiber-based optical alignment system in accordance with the present invention. More particularly, an optical fiber holding means 202 is shown in cross-section, along with a plurality of receiver fibers 204 and an illumination fiber 206, each of which passes through optical fiber holding means 202. Illumination fiber 206 is optically coupled to a light source 208. Light source 208 may be any suitable illumination source including but not limited to visible light, infra-red light, or ultra-violet light. Receiver fibers 204 are optically coupled to a light detector 210. Light detector 210 may be any suitable means for detecting the amplitude of light signals reflected from the bond-pad-side surface of wafer 100. In the illustrative example of FIG. 2, the bond-pad-side surface of wafer 100 corresponds to the exposed surface of topside passivation layer 106 and the exposed surface of bond pad 108.

In some embodiments of the present invention, optical fiber holding means 202 may be a wafer translator that is being aligned to a wafer. In other embodiments, optical fiber holding means 202 may be a fixture having a known spaced apart relationship to a wafer translator being aligned to a wafer. Such a fixture may be formed from any suitable material, and is configured to secure the fibers of the fiber bundle in a know spatial relationship with each other. It may be beneficial for optical fiber holding means 202 to be constructed from one or more materials such that optical fiber holding means 202 is not a significant source of particulate contamination, since it is preferable to keep the bond pads free from contamination.

Still referring to FIG. 2, light source 208 and light detector 210 are each coupled to processing and control circuitry block 212. Processing and control circuitry block 212 provides control signals to, and receives information from, light source 208 and light detector 210. Those skilled in the art and having the benefit of this disclosure will recognize that control signals provided by circuitry block 212 may take any suitable form, for example analog or digital, and will similarly recognize that processing and control circuitry block 212 may be implemented as a microcontroller programmed to perform the appropriate control operations, or may be implemented completely in hardware, for example logic circuits without the need for stored program instructions.

It is noted that the illumination provided by light source 208 should be detectable by light detector 210 after transmission through illumination fiber 206, reflection from bonding pad 108, and transmission through receiver fibers 204.

The relative dimensions of the various layers and structures of wafer 100 in FIGS. 1 and 2 are not necessarily drawn to scale, but are rather for illustrative purposes. It is further noted that the sidewalls of opening 110 are slightly sloped rather than perfectly perpendicular to the surface of bond pad 108. Since the sidewalls of opening 110 are sloping, the thickness of topside passivation layer 106 varies across that portion of bond pad 108 that it overlaps. In some embodiments, the changing thickness of topside passivation layer 106 at the edges of bond pad 108 may provide reflectivity properties that are different from those of both the bond pad metal and the passivation layer over dielectric layer 104.

Figure 3:
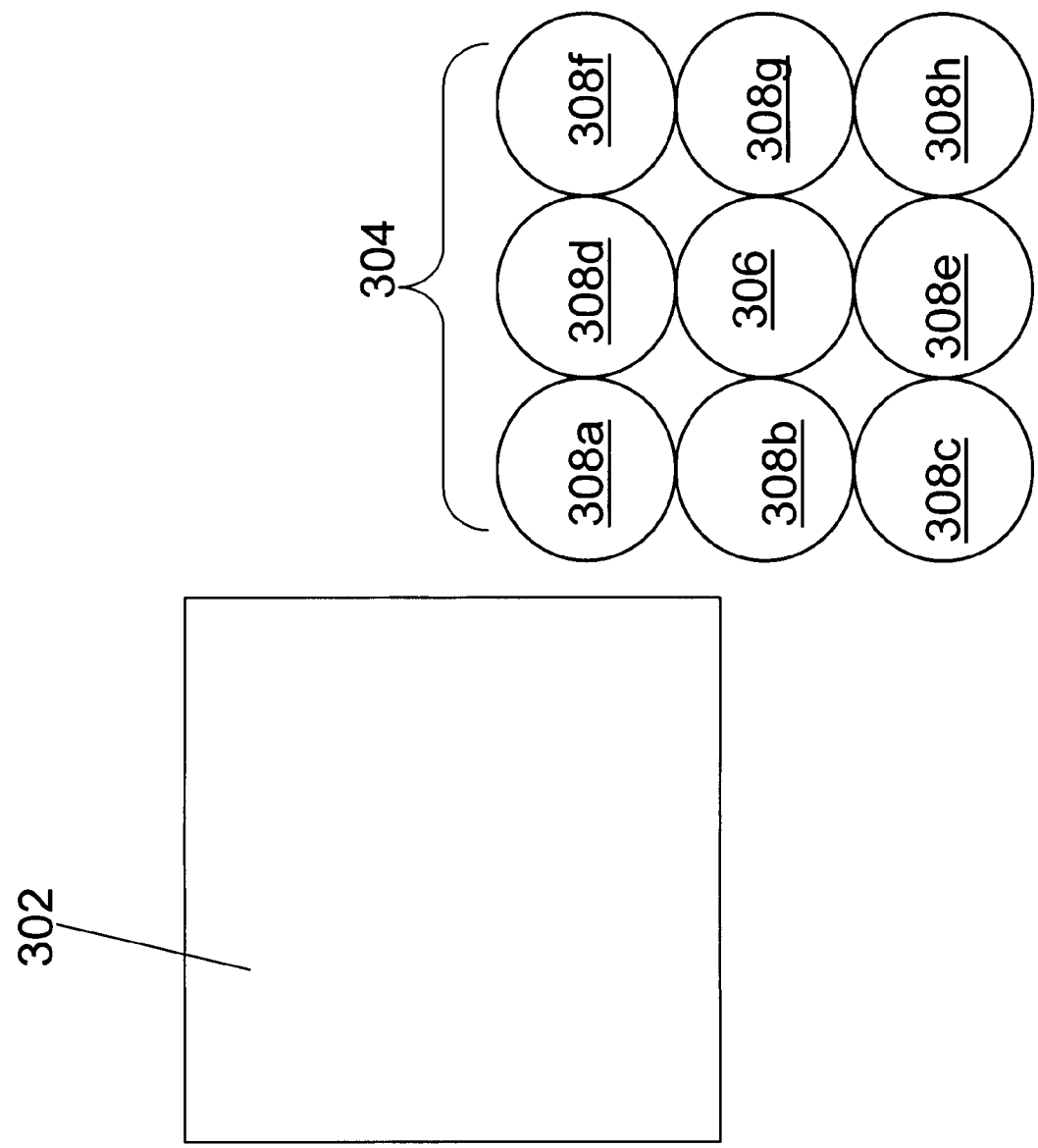
FIG. 3 shows an illustrative fiber-bundle in accordance with the present invention and its x-y position relative to a bonding pad of an integrated circuit.

Referring to FIGS. 3-13, an illustrative embodiment of the present invention is described. More particularly, FIG. 3 shows a bonding pad 302, a fiber bundle 304, and the relative x-y positions of pad 302 and bundle 304. In this example, bonding pad 302 is disposed on an integrated circuit, which is unsingulated, i.e., the integrated circuit is still in wafer form. Bonding pad 302, as shown, is the exposed portion of the pad metal, and for simplicity of illustration does not show the pad metal that extends under a topside passivation layer (see FIGS. 1-2).

It is noted that bundle 304 includes a central illuminating fiber 306 and a plurality of receiver fibers 308*a*-308*h* (collectively referred to as 308). Bundle 304 may be permanently or removably attached to a fixture that is to be aligned with pad 302. Regardless of whether bundle 304 is permanently or removably attached, during the alignment process it is preferred that bundle 304 have a fixed spatial relationship to the fixture.

The general principles of operation are as follows. The reflectivity of the surface of a wafer is not uniform, and more particularly the metallized bond pads are more highly reflective than the surface of the topside passivation layer, which is disposed over a dielectric layer. By illuminating the surface of a wafer through an optical fiber and recovering reflected light through a plurality of receiver fibers, which have a known spatial relationship to each other, a determination can be made as to whether the bundle of optical fibers (illuminating and receiver fibers together) is aligned to a bond pad. This determination is made by evaluating the amount of reflected light delivered by each of the receiver fibers to the light detector, and moving the optical fiber bundle in a predetermined manner until the amount of reflected light delivered by each of the receiver fibers to the light detector is above a predetermined threshold and substantially equal. By ensuring that the light amplitude is above a predetermined threshold, it is possible to distinguish alignment to a pad from simply receiving substantially the same reflected light from the passivation layer. It is noted that the predetermined movement of the optical fiber bundle may be in x, y, theta, or any combination thereof. Since the bundle of optical fibers has a known spatial relationship to the apparatus which is to be aligned to the wafer, the spatial relationship between that apparatus and the wafer can be determined. With the spatial relationship between the apparatus to be aligned and the wafer having been determined, the two elements can then be brought into contact, or otherwise operationally engaged. In some embodiments the bundle of optical fibers is built into the apparatus being brought into alignment with the wafer, in which case, when the optical fiber bundle is aligned the apparatus itself is aligned. In some embodiments the bundle of optical fibers has a known spatial relationship to the apparatus to be aligned with the wafer, in which case, once the optical fiber bundle is aligned to the wafer, the apparatus can be moved in a known way so that it too is properly aligned.

In operation, bundle 304 is disposed in the vicinity of a wafer, and a light of a predetermined frequency, or range of frequencies, is provided through illuminating fiber 306. A portion of the light reflected from the surface of the wafer is picked up by various ones of receiver fibers 308. The reflected light that travels through receiver fibers 308 is received by a light detector, as described above in connection with FIG. 2. In this illustrative embodiment, the light detector produces, for each of receiver fibers 308, a signal representative of the amplitude of the reflected light signal delivered through each of receiver fibers 308 (referred to as amplitude signals). Processing circuitry coupled to the light detector determines, based at least in part on the amplitude signals, whether all the receiver fibers are carrying substantially the same amount of reflected light. If they are carrying substantially the same amount of light, and are above a predetermined threshold then alignment is complete. This predetermined threshold is set such that substantially equal light from the receiver fibers when they are all equally over the passivation layer is not considered to be a complete alignment. If all the receiver fibers are not carrying substantially the same amount of reflected light, then the bundle of optical fibers is moved in x, y, and/or theta and the process of illuminating the surface and evaluating the recovered light is repeated.

Referring to FIG. 3, bundle 304 is shown in cross-section disposed over a field portion of an integrated circuit, and offset in x and y from pad 302. In this position, receiver fibers 308*a*-308*h* will receive substantially equal amounts of reflected light because they are all disposed over a portion of the integrated circuit having substantially equal reflectivity. However, the amount of light delivered to the light detector through receiver fibers 308*a*-308*h* will be below the predetermined threshold that is set such that the amount of light required for making a determination that alignment is complete can only be received from the more highly reflective pad 302.

Figure 4:
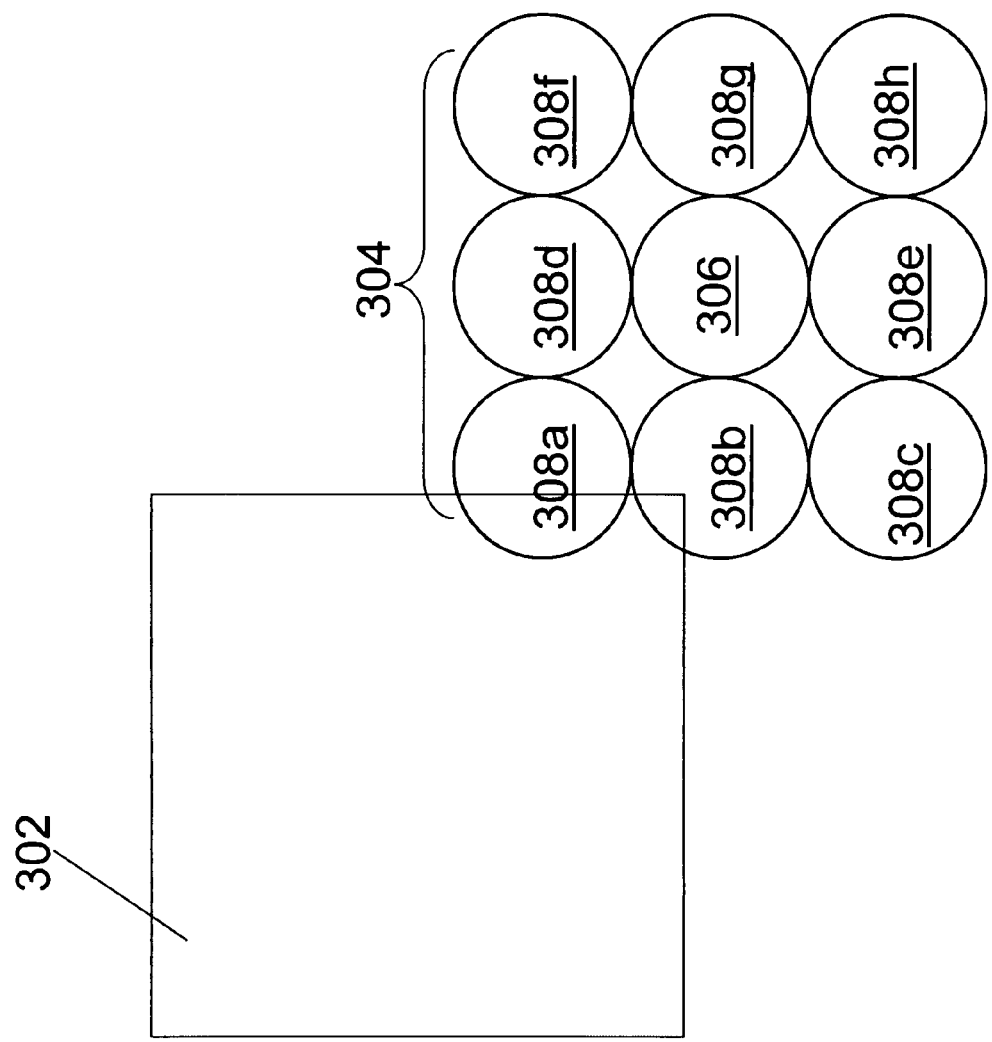
FIG. 4 shows an illustrative fiber-bundle in accordance with the present invention and its x-y position relative to a bonding pad of an integrated circuit.

Referring to FIG. 4, it can be seen that bundle 304 has moved relative to pad 302 as compared to the positions shown in FIG. 3. Receiver fibers 308*a* and 308*b* recover some light reflected from pad 302, whereas the remainder of the receiver fibers only recover light from the less reflective topside area of the integrated circuit. In this case, the processing and control circuitry determines that a pad edge has been detected as a consequence of the move to the left (i.e., −x direction).

Figure 5:
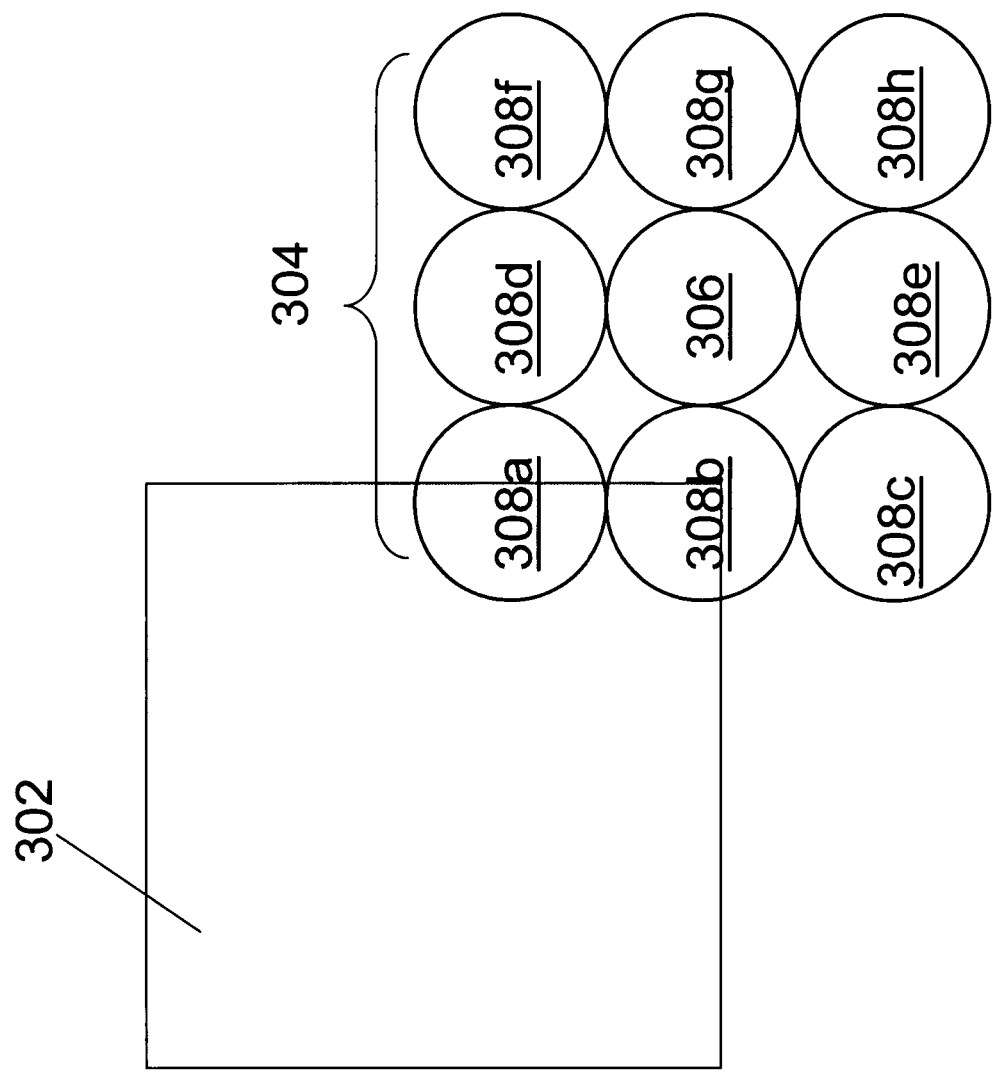
FIG. 5 shows an illustrative fiber-bundle in accordance with the present invention and its x-y position relative to a bonding pad of an integrated circuit.

Referring to FIG. 5, it can be seen that, under control of the processing and control circuitry, bundle 304 is further moved left and up (i.e., −x and +y). In this case, receiver fibers 308*a* and 308*b* recover more light reflected from pad 302 (as compared to the arrangement of FIG. 4), whereas the remainder of the receiver fibers only recover light from the less reflective topside area of the integrated circuit. Processing and control circuitry recognizes that the −x and +y step has produced a result indicating that bundle 304 has moved closer to alignment with pad 302, and generates the control signals necessary to move bundle 304 again.

Figure 6:
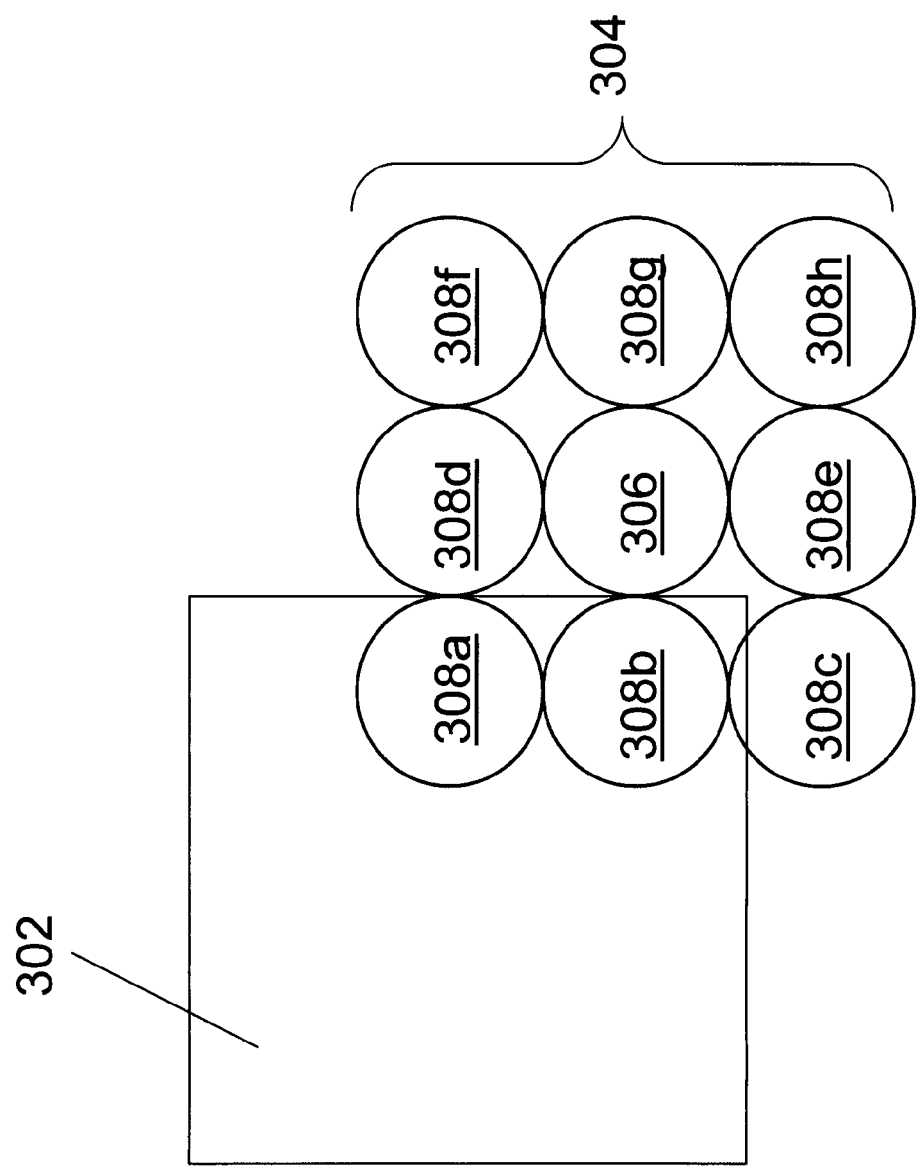
FIG. 6 shows an illustrative fiber-bundle in accordance with the present invention and its x-y position relative to a bonding pad of an integrated circuit.

Referring to FIG. 6, it can be seen that, under control of the processing and control circuitry, bundle 304 is further moved left and up (i.e., −x and +y). Receiver fibers 308a and 308b recover still more light reflected from pad 302 (as compared to the arrangement of FIG. 5), and receiver fiber 308c is also starting to recover light from pad 302, whereas the remainder of the receiver fibers only recover light from the less reflective topside area of the integrated circuit.

Figure 7:
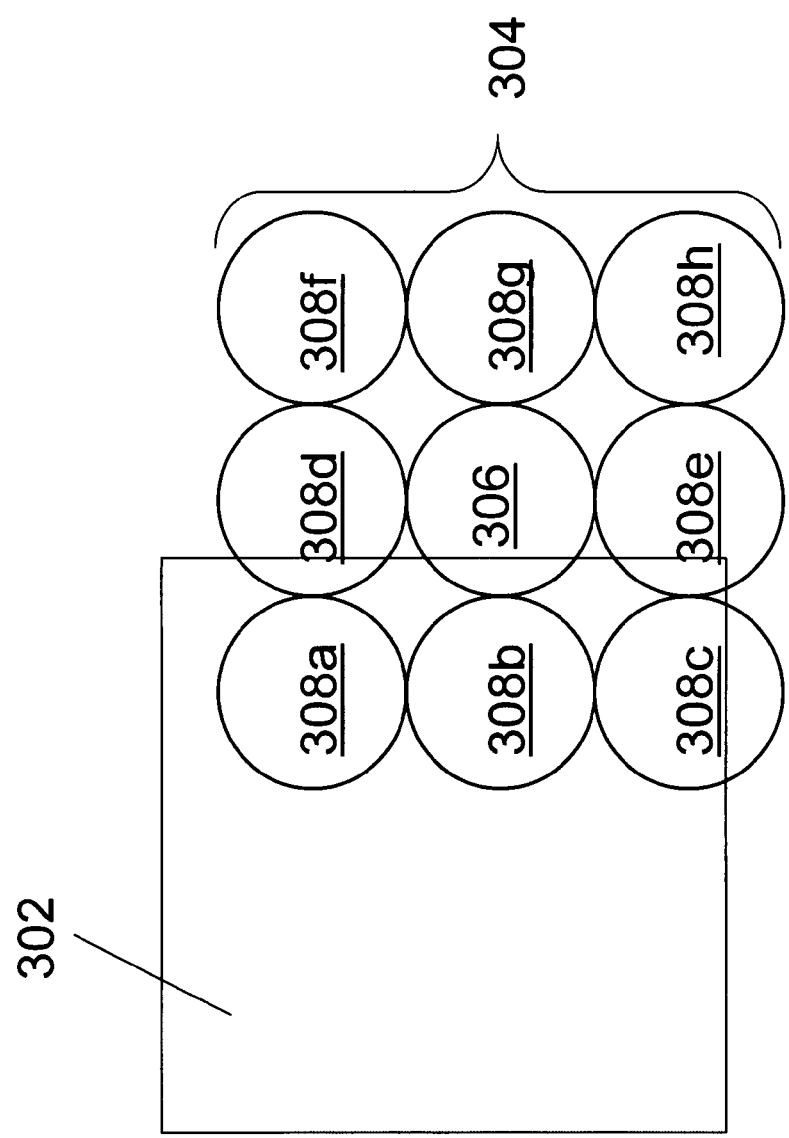
FIG. 7 shows an illustrative fiber-bundle in accordance with the present invention and its x-y position relative to a bonding pad of an integrated circuit.

Referring to FIG. 7, it can be seen that, under control of the processing and control circuitry, bundle 304 is further moved left and up (i.e., −x and +y). Receiver fibers 308a and 308b are fully disposed over pad 302, and receiver fibers 308c, 308d and 308e are partially recovering light from pad 302, whereas the remainder of the receiver fibers only recover light from the less reflective topside area of the integrated circuit.

Figure 8:
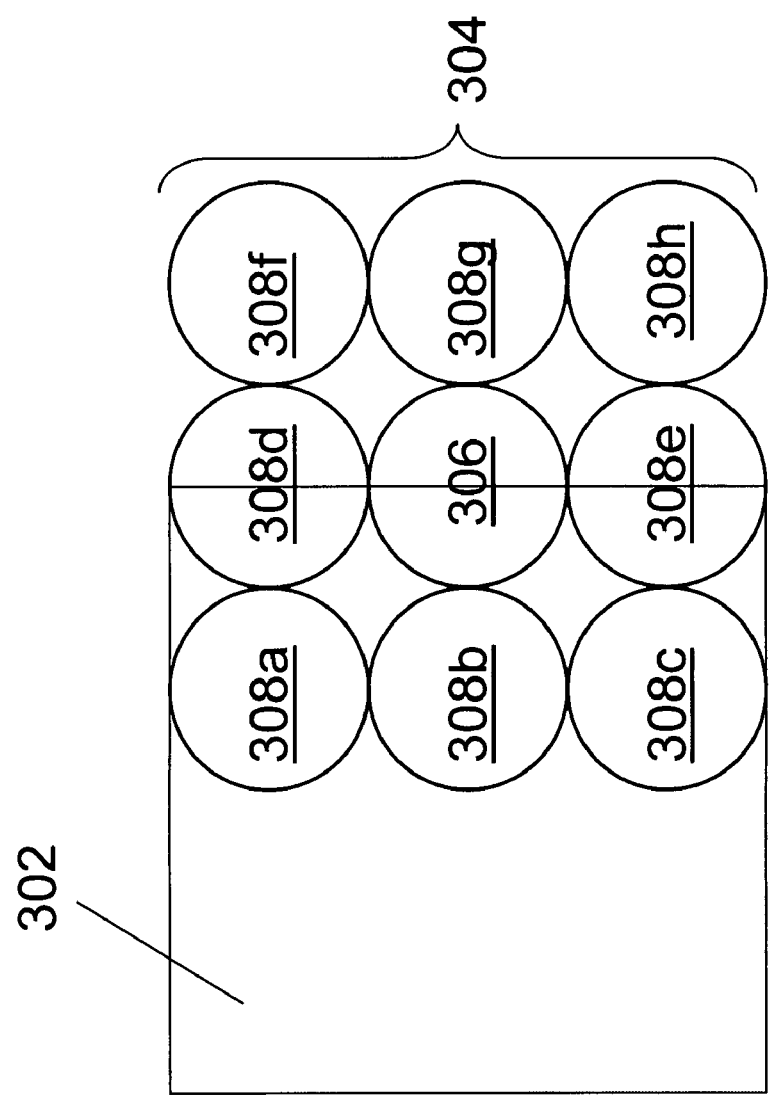
FIG. 8 shows an illustrative fiber-bundle in accordance with the present invention and its x-y position relative to a bonding pad of an integrated circuit.

Based upon the amount of light received from the various receiver fibers, the processing and control circuitry determines that further moving to the left and up (i.e., −x and +y) will more closely align bundle 304 with pad 302. As shown in FIG. 8, receiver fibers 308a, 308b and 308c are fully disposed over pad 302; receiver fibers 308d and 308e are partially disposed over pad 302; and receiver fibers 308f, 308g and 308h are fully disposed over the field area.

Figure 9:
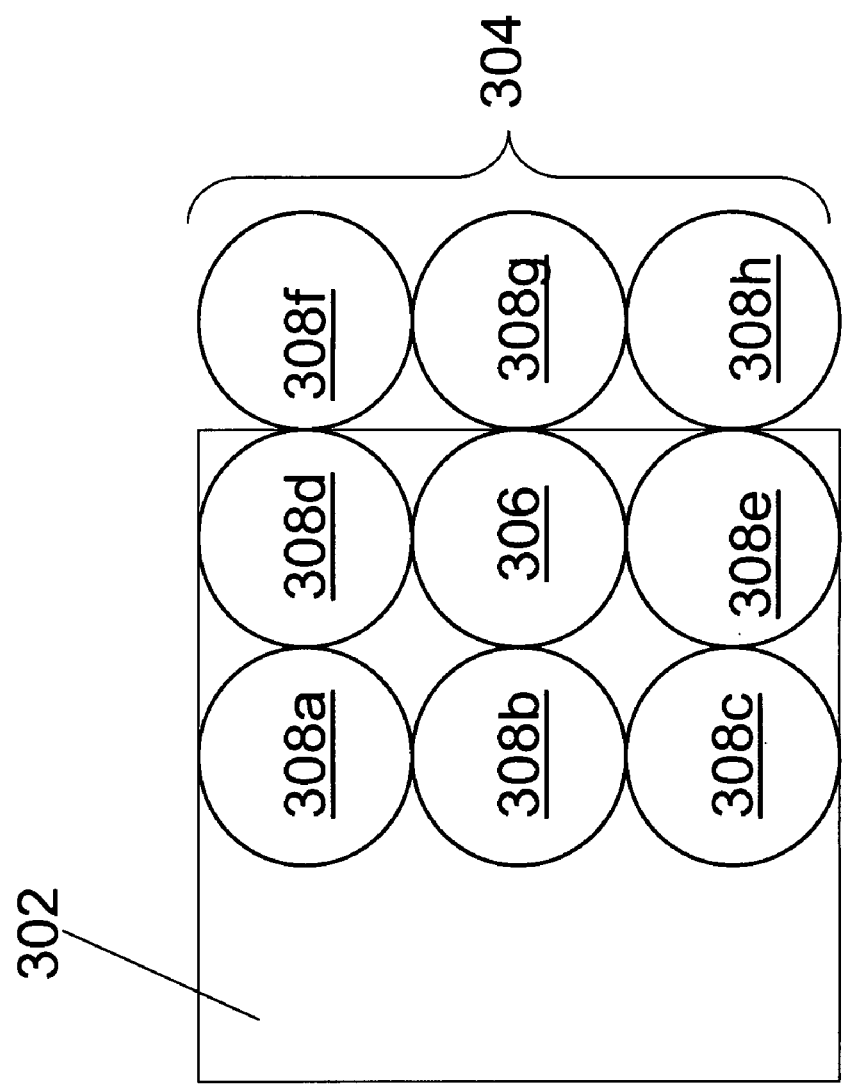
FIG. 9 shows an illustrative fiber-bundle in accordance with the present invention and its x-y position relative to a bonding pad of an integrated circuit.

Based upon the amount of light received from the various receiver fibers, the processing and control circuitry determines that further moving to the left (i.e., −x) will more closely align bundle 304 with pad 302. As shown in FIG. 9, receiver fibers 308a, 308b, 308c, 308d and 308e are fully disposed over pad 302; and receiver fibers 308f, 308g and 308h are fully disposed over the field area.

Figure 10:
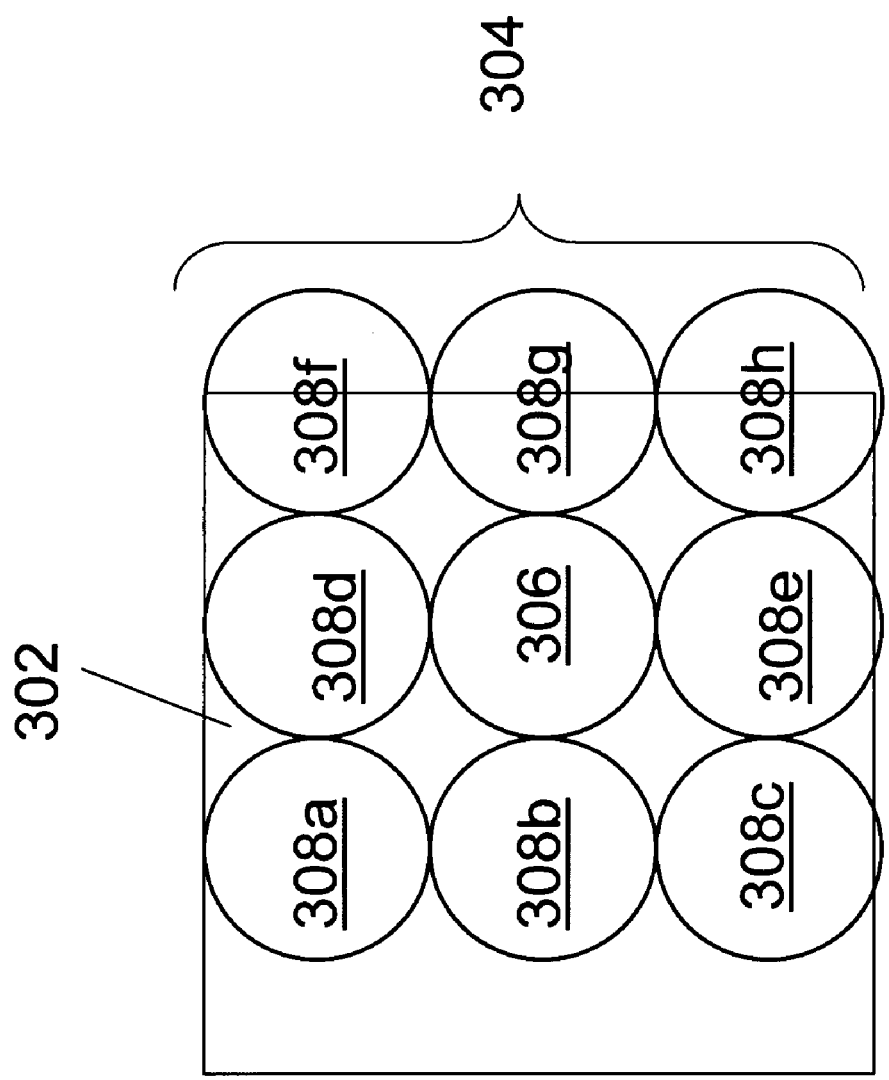
FIG. 10 shows an illustrative fiber-bundle in accordance with the present invention and its x-y position relative to a bonding pad of an integrated circuit.

Based upon the amount of light received from the various receiver fibers, the processing and control circuitry determines that further moving to the left (i.e., −x) will more closely align bundle 304 with pad 302. As shown in FIG. 10, receiver fibers 308a, 308b, 308c, 308d and 308e are fully disposed over pad 302; and receiver fibers 308f, 308g and 308h are partially disposed over the field area.

Figure 11:
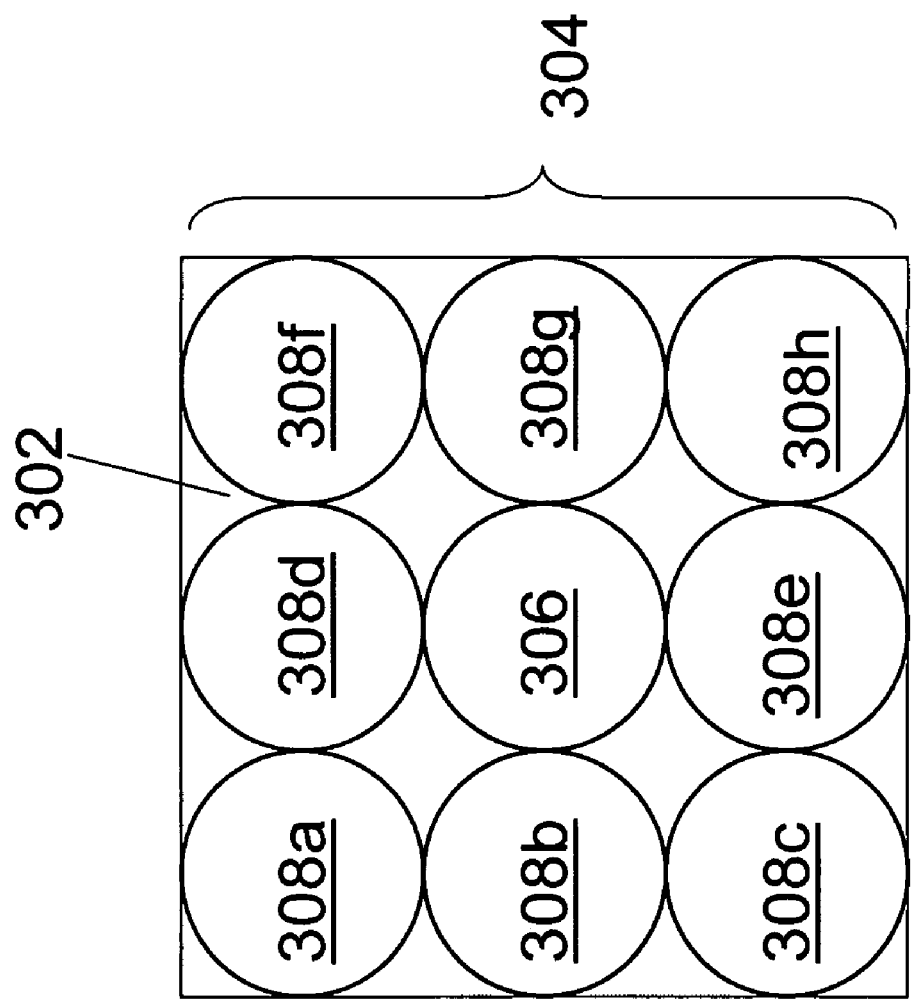
FIG. 11 shows an illustrative fiber-bundle in accordance with the present invention and its x-y position relative to a bonding pad of an integrated circuit.

Based upon the amount of light received from the various receiver fibers, the processing and control circuitry determines that further moving to the left (i.e., −x) will more closely align bundle 304 with pad 302. As shown in FIG. 11, receiver fibers 308a, 308b, 308c, 308d, 308e, 308f, 308g and 308h are fully disposed over pad 302. In some embodiments of the present invention, the processing and control circuitry determines that alignment is complete since all the receiver fibers are now recovering substantially the same amount of reflected light. In other embodiments, further actions are taken to ensure that the optical bundle is not only disposed over the pad, but that it is centered over the pad.

Figure 12:
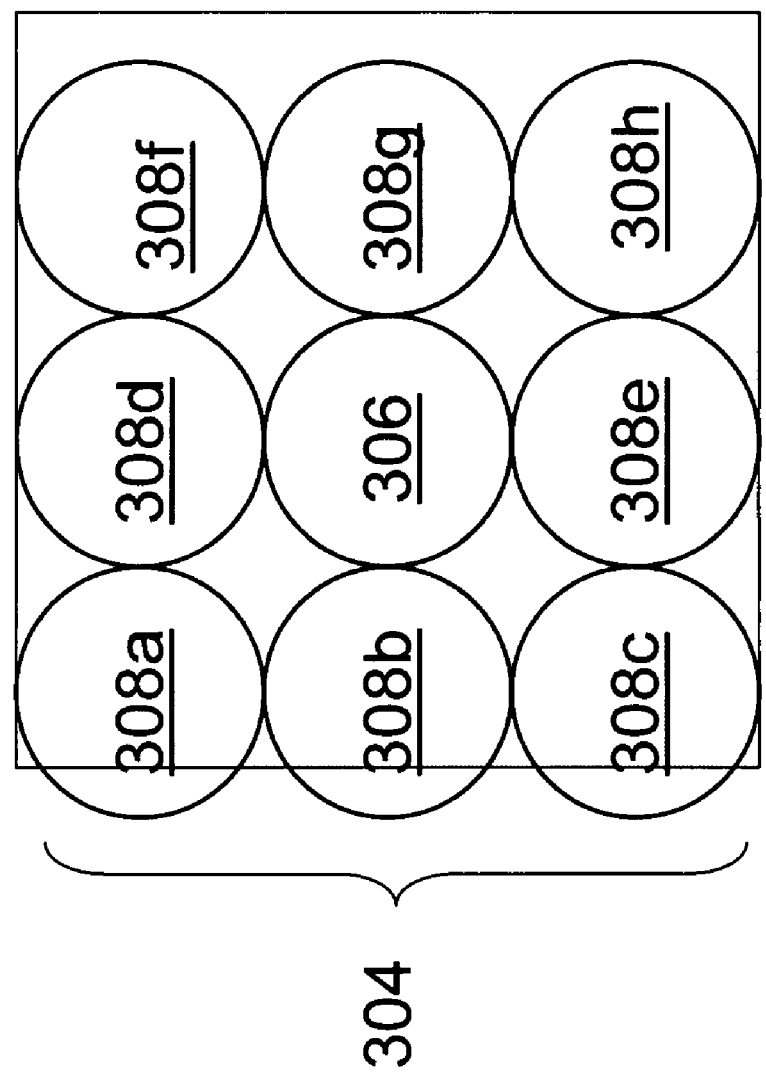
FIG. 12 shows an illustrative fiber-bundle in accordance with the present invention and its x-y position relative to a bonding pad of an integrated circuit.
Figure 13:
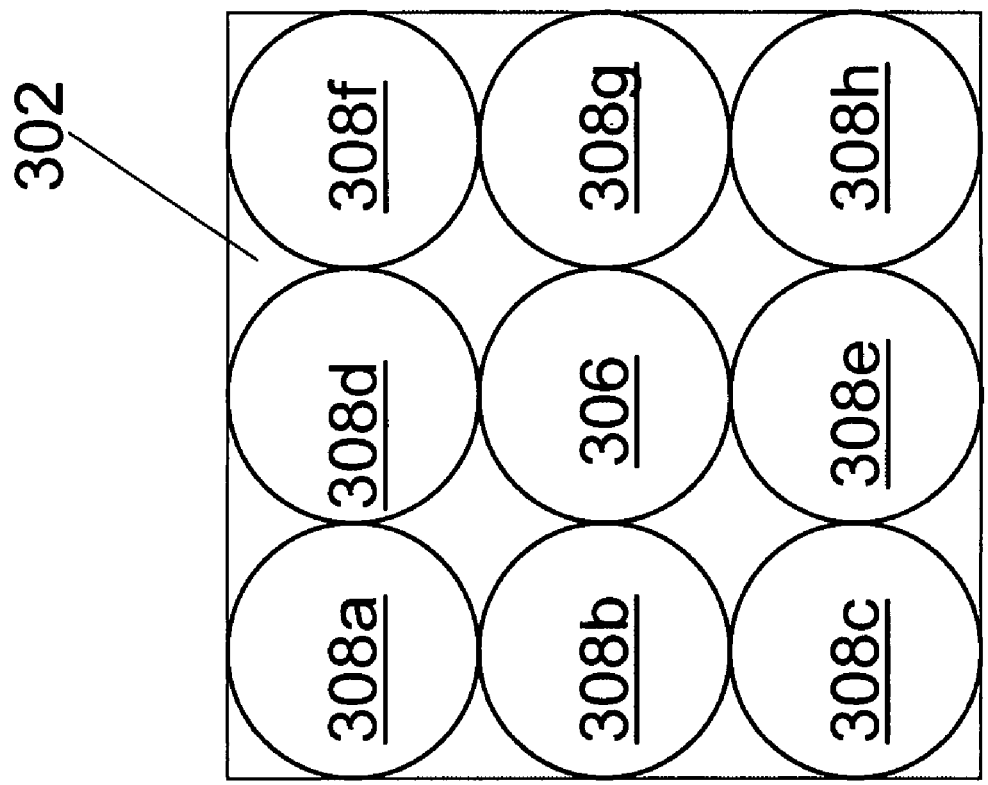
FIG. 13 shows an illustrative fiber-bundle in accordance with the present invention and its x-y position relative to a bonding pad of an integrated circuit.

Referring to FIG. 11, it can be seen that bundle 304 is disposed over pad 302, however processing and control circuitry generates the signals needed to move bundle 304, in this illustrative case to the left (i.e., −x). Referring to FIG. 12, bundle 304 has moved such that receiver fibers 308a, 308b and 308c are only partially disposed over pad 302 and consequently the amount of light received from those receiver fibers is diminished as compared to the amount recovered in their immediately preceding position. This diminution of recovered light indicates that bundle 304 has traveled too far to the left (i.e., −x direction), and therefore bundle 304 should move back to its previous position. As can be seen in FIG. 13, processing and control circuitry has directed bundle 304 to move to the right (i.e., +x). Having returned to the position of wherein all the receiver fibers are recovering substantially the same amount of light above a predetermined threshold, the alignment process is complete.

The present invention is not limited to a single illuminating fiber per bundle. Various alternative embodiments may have more or fewer receiver fibers than the eight receiver fibers shown in this illustrative embodiment. In various alternative embodiments the fibers are spaced apart from each other rather than touching as shown in FIGS. 3-13.

In some embodiments, the optical fiber bundle is moved as described above until alignment is reached, and then the optical fiber bundle is moved out of the way so that an apparatus, for example, a wafer translator having a known spatial relationship with the optical fiber bundle, can be moved into an aligned position using the coordinate information (x, y, theta) of the optical fiber bundle's aligned position.

In some embodiments, a determination is made regarding whether the light level, i.e., amplitude, of the reflected light returned by the receiver fibers is within a predetermined range. If this light level is below the predetermined range then a signal or message is generated by the processing and control circuitry indicating the insufficient reflected light is available to reliably perform the alignment operation.

In some embodiments, the determination as to whether the amplitudes of the reflected light delivered by the receiver fibers to the light detector are substantially equal is accomplished by finding the largest and smallest amplitudes and determining that the difference between the largest and smallest amplitudes is within a predetermined threshold of each other.

In some embodiments, the determination as to whether the amplitudes of the reflected light delivered by the receiver fibers to the light detector are substantially equal is accomplished by comparing the amplitudes of the light from each of the receiver fibers and determining that those amplitudes are all within a predetermined range.

In some embodiments, the determination as to whether the amplitudes of the reflected light delivered by the receiver fibers to the light detector are substantially equal is accomplished by evaluating the light received from only a subset of the plurality of receiver fibers.

In some embodiments, alignment to a "dark" target is desired. By dark target, it is meant that the target structure for alignment is less reflective than the remaining field area. In such a case, the process is slightly different than described above in connection with aligning to a target that is more highly reflective than the surrounding field area. In aligning to a dark target, the determination of alignment is made by evaluating the amount of reflected light delivered by each of the receiver fibers to the light detector, and moving the optical fiber bundle in a predetermined manner until the amount of reflected light delivered by each of the receiver fibers to the light detector is below a predetermined threshold and substantially equal.

In some embodiments, illumination is supplied through the illumination fiber continuously during the alignment process. In other embodiments, illumination is supplied through the illumination fiber at predetermined times, such as, for example, when the optical fiber bundle is stopped at a position where an alignment reading is to take place.

In some embodiments the x, y, and/or theta steps are always a fixed amount. In other embodiments, these step sizes may be varied, based, at least in part, upon a determination that the optical fiber bundle is over a field area as opposed to partly over field and partly over a pad. By using larger steps when the bundle is over a field area and smaller steps when at least partly over a pad, the speed and accuracy of the alignment process are improved.

Figure 14:
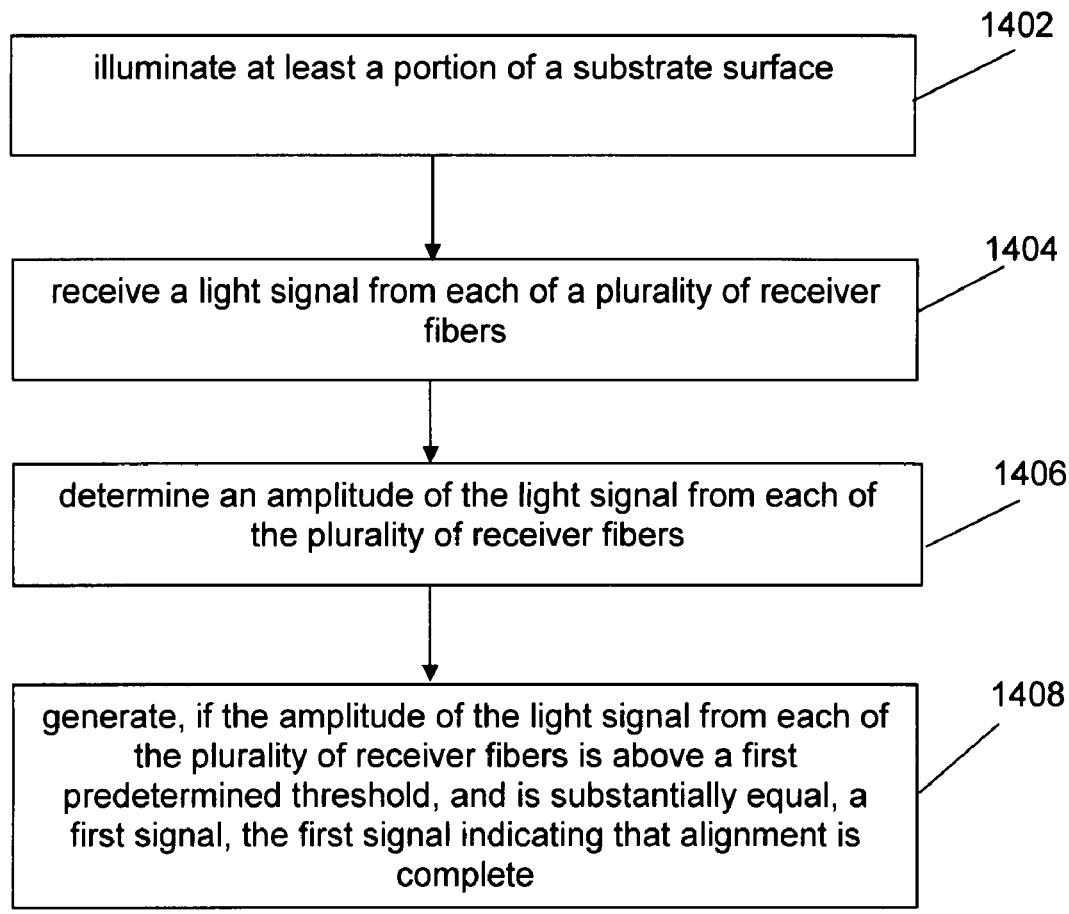
FIG. 14 is a flow diagram illustrating a method of aligning, in accordance with the present invention, a wafer translator with a wafer.

FIG. 14 illustrates a method of aligning a fixture, such as a wafer translator, to a substrate in accordance with the present invention. Such a method includes illuminating 1402 at least a portion of a substrate surface; receiving 1404 a light signal from each of a plurality of receiver fibers; determining 1406 an amplitude of the light signal from each of the plurality of receiver fibers; and generating 1408, if the amplitude of the light signal from each of the plurality of receiver fibers is above a first predetermined threshold, and is substantially equal, a first signal, the first signal indicating that alignment is complete.

CONCLUSION

The exemplary methods and apparatus illustrated and described herein find application in the field of integrated circuit test and analysis.

It is to be understood that the present invention is not limited to the embodiments described above, but encompasses any and all embodiments within the scope of the subjoined Claims and their equivalents.

What is claimed is:

1. A method of aligning a fixture to a substrate, comprising:
   a) providing at least one illumination fiber coupled at a first end thereof to a light source, and a plurality of receiver fibers, each receiver fiber coupled, at a respective first end thereof, to a corresponding detector;
   b) illuminating at least a portion of a substrate surface with light from a second end of the at least one illumination fiber;
   c) receiving light reflected from the substrate surface at the respective second ends of the receiver fibers, and receiving, at the detectors, a light signal from each of a plurality of receiver fibers;
   d) determining an amplitude of the light signal from each of the plurality of receiver fibers; and
   e) generating, if the determination of (d) is that the amplitude of the light signal from each of the plurality of receiver fibers is above a first predetermined threshold, and is substantially equal, a first signal, the first signal indicating that alignment is complete.

2. The method of claim 1, further comprising:
   generating, if the determination of (d) is that the amplitude of the light signal from each of the plurality of receiver fibers is not substantially equal, a second signal, the second signal indicating that an x-y-theta position of the at least one illumination fiber and the plurality of receiver fibers relative to the substrate is to be changed.

3. The method of claim 1, further comprising:
   generating, if the determination of (d) is that the amplitude of the light signal from each of the plurality of receiver fibers is below the first predetermined threshold, a second signal, the second signal indicating that an x-y-theta position of the at least one illumination fiber and the plurality of receiver fibers relative to the substrate is to be changed.

4. The method of claim 3, wherein a first step size for changing the x-y-theta position of the at least one illumination fiber and the plurality of receiver fibers is selected based, at least in part, upon a determination that the at least one illumination fiber and the plurality of receiver fibers are disposed over a field area and not disposed partly over a pad.

5. The method of claim 4, wherein a second step size for changing the x-y-theta position of the at least one illumination fiber and the plurality of receiver fibers is selected for accurately positioning the fiber bundle.

6. The method of claim 1, wherein illuminating is performed continuously.

7. The method of claim 1, wherein illuminating is performed at times when the at least one illumination fiber and the plurality of receiver fibers is positioned for recovering reflected light.

8. The method of claim 1, wherein the determination as to whether the amplitudes of the light signals are substantially equal is accomplished by finding the largest and smallest amplitudes and determining that the difference between the largest and smallest amplitudes is within a predetermined threshold of each other.

9. The method of claim 1, wherein the determination as to whether the amplitudes of the light signal are substantially equal is accomplished by comparing the amplitudes of the light from each of the receiver fibers and determining that those amplitudes are all within a predetermined range.

10. The method of claim 1, wherein the determination as to whether the amplitudes of the light signal are substantially equal is accomplished by evaluating the light received from only a subset of the plurality of receiver fibers.

11. A method of aligning a fixture to a substrate, comprising:
    a) providing at least one illumination fiber coupled at a first end thereof to a light source, and a plurality of receiver fibers, each receiver fiber coupled, at a respective first end thereof, to a corresponding detector;
    b) illuminating at least a portion of a substrate surface with light from a second end of the at least one illumination fiber;
    c) receiving light reflected from the substrate surface at the respective second ends of the receiver fibers, and receiving, at the detectors, a light signal from each of a plurality of receiver fibers;
    d) determining an amplitude of the light signal from each of the plurality of receiver fibers; and
    e) generating, if the determination of (d) is that the amplitude of the light signal from each of the plurality of receiver fibers is below a first predetermined threshold, and is substantially equal, a first signal, the first signal indicating that alignment is complete;
    wherein the substrate includes a field area and at least one target structure, and the field area has a higher reflectivity than the at least one target structures.

12. The method of claim 11, wherein the fixture is a wafer translator and the substrate is a semiconductor wafer.

13. A method of aligning a fixture to a substrate, comprising:
    a) providing at least one illumination fiber coupled at a first end thereof to a light source, and a plurality of receiver fibers, each receiver fiber coupled, at a respective first end thereof, to a corresponding detector;
    b) illuminating at least a portion of a substrate surface with light from a second end of the at least one illumination fiber;
    c) receiving light reflected from the substrate surface at the respective second ends of the receiver fibers, and receiving, at the detectors, a light signal from each of a plurality of receiver fibers;
    d) determining an amplitude of the light signal from each of the plurality of receiver fibers; and e) generating, if the determination of (d) is that the amplitude of the light signal from each of the plurality of receiver fibers is above a first predetermined threshold, and is substantially equal, a first signal, the first signal indicating that alignment is complete;

f) selecting a first step size for changing the x-y-theta position of the at least one illumination fiber and the plurality of receiver fibers based, at least in part, upon a determination that the plurality of receiver fibers are disposed over a field area and not disposed partly over a pad; and g) selecting a second step size for changing the x-y-theta position of the at least one illumination fiber and the plurality of receiver fibers based, at least in part, upon a determination that at least a portion of the plurality of receiver fibers are disposed over a target structure;

wherein the first step size is greater than the second step size; and wherein the substrate includes a field area and at least one target structure, and the at least one target structure has a higher reflectivity than the field area.

14. The method of claim 13, wherein the second end of each receiver fiber has a known spatial relationship to the second end of the at least one illumination fiber.

15. The method of claim 13, wherein there is a known spatial relationship between the second end of each receiver fiber and the fixture.

16. The method of claim 15, wherein the substrate is a wafer, and the fixture is a wafer translator.

17. The method of claim 13, wherein at least portions of the illumination and receiver fibers, adjacent the respective second ends thereof are held by an optical fiber holding means.

18. The method of claim 17, wherein the optical fiber holding means is a wafer translator.

* * * * *